(12) United States Patent
Battista et al.

(10) Patent No.: US 8,445,947 B2
(45) Date of Patent: May 21, 2013

(54) ELECTRONIC CIRCUIT HAVING A DIODE-CONNECTED MOS TRANSISTOR WITH AN IMPROVED EFFICIENCY

(75) Inventors: Marc Battista, Marseilles (FR); Hervé Chalopin, Aubagne (FR); Hervé Barthelemy, Toulon (FR)

(73) Assignees: STMicroelectronics (Rousset) SAS, Rousset (FR); Université de Provence (Aix-Marseille I), Marseille Cedex 3 (FR)

( * ) Notice: Subject to any disclaimer, the term of this patent is extended or adjusted under 35 U.S.C. 154(b) by 570 days.

(21) Appl. No.: 12/497,210

(22) Filed: Jul. 2, 2009

(65) Prior Publication Data

US 2010/0034000 A1 Feb. 11, 2010

(30) Foreign Application Priority Data

Jul. 4, 2008 (FR) ...................... 08 54555

(51) Int. Cl.
*H01L 21/28* (2006.01)
(52) U.S. Cl.
USPC ......................................... 257/288
(58) Field of Classification Search
USPC ............... 257/365, 127, 133–136, 294, 288
See application file for complete search history.

(56) References Cited

U.S. PATENT DOCUMENTS

| | | | | |
|---|---|---|---|---|
| 5,240,865 A * | 8/1993 | Malhi | | 438/135 |
| 5,394,365 A | 2/1995 | Tsukikawa | | |
| 6,066,863 A * | 5/2000 | Fujishima | | 257/133 |
| 6,337,501 B1 * | 1/2002 | Fukuda et al. | | 257/350 |
| 6,414,830 B1 * | 7/2002 | Yu | | 361/56 |
| 6,465,283 B1 * | 10/2002 | Chang et al. | | 438/135 |
| 6,492,208 B1 * | 12/2002 | Cheng et al. | | 438/133 |
| 7,262,442 B2 * | 8/2007 | Menard | | 257/123 |
| 7,430,099 B2 * | 9/2008 | Kwak et al. | | 361/56 |
| 7,839,613 B2 * | 11/2010 | Kwak et al. | | 361/56 |
| 2002/0066929 A1 * | 6/2002 | Voldman | | 257/355 |
| 2002/0177324 A1 | 11/2002 | Metzler | | |
| 2002/0179945 A1 * | 12/2002 | Sakamoto et al. | | 257/288 |
| 2005/0068014 A1 * | 3/2005 | Dillon et al. | | 323/268 |
| 2005/0142792 A1 * | 6/2005 | Williams et al. | | 438/369 |
| 2005/0179089 A1 * | 8/2005 | Shimizu | | 257/358 |
| 2005/0179093 A1 * | 8/2005 | Morris | | 257/371 |
| 2006/0009256 A1 * | 1/2006 | Frank et al. | | 455/556.1 |
| 2006/0092099 A1 * | 5/2006 | Matsuda | | 345/46 |
| 2006/0186469 A1 | 8/2006 | Nakamura | | |
| 2006/0238252 A1 | 10/2006 | Crawley | | |

(Continued)

FOREIGN PATENT DOCUMENTS

EP 1855315 A 11/2007

OTHER PUBLICATIONS

Horowitz, P. et al. "The art of electronics, second edition." XP002512308. Cambridge University Press, pp. 46-48; 355-359.

(Continued)

*Primary Examiner* — Nathan Ha
(74) *Attorney, Agent, or Firm* — Wolf, Greenfield & Sacks, P.C.

(57) ABSTRACT

An integrated circuit including a semiconductor layer; and a MOS transistor including first and second power terminals and a bulk insulated from the semiconductor layer, the first power terminal being intended to receive an oscillating signal, the transistor gate and the bulk being connected to the first power terminal.

33 Claims, 4 Drawing Sheets

U.S. PATENT DOCUMENTS

| | | | |
|---|---|---|---|
| 2006/0244079 A1* | 11/2006 | Wang et al. | 257/407 |
| 2007/0007996 A1* | 1/2007 | Ranganathan et al. | 326/34 |
| 2008/0142893 A1* | 6/2008 | Hung et al. | 257/368 |
| 2008/0191286 A1* | 8/2008 | Chang et al. | 257/369 |
| 2008/0284929 A1* | 11/2008 | Kimura | 349/38 |
| 2009/0098692 A1* | 4/2009 | Lian et al. | 438/199 |
| 2011/0248361 A1* | 10/2011 | Ito et al. | 257/411 |
| 2011/0260250 A1* | 10/2011 | Miller et al. | 257/347 |

OTHER PUBLICATIONS

French Search Report dated Jan. 28, 2009 from French Patent Application No. 08/54555.

* cited by examiner

ELECTRONIC CIRCUIT HAVING A DIODE-CONNECTED MOS TRANSISTOR WITH AN IMPROVED EFFICIENCY

CROSS REFERENCE TO RELATED APPLICATIONS

This application claims the priority benefit of French patent application number 08/54555, filed on Jul. 4, 2008, entitled "ELECTRONIC CIRCUIT COMPRISING A DIODE-CONNECTED MOS TRANSISTOR WITH AN IMPROVED EFFICIENCY," which is hereby incorporated by reference to the maximum extent allowable by law.

BACKGROUND OF THE INVENTION

1. Field of the Invention

The present invention relates to an electronic circuit comprising a diode-connected MOSFET or MOS transistor having one of its power terminals receiving an oscillating signal, for example, an A.C. signal.

2. Discussion of the Related Art

Many electronic circuits perform a power conversion. Most often, it is a conversion of an A.C. input signal formed of a succession of positive and negative halfwaves, into a D.C. signal. One of the simplest electronic circuits to perform this function is a single-wave rectifier circuit. It is formed of a rectifying stage, followed by a filtering stage. The rectifying stage may comprise a diode which enables to keep, for example, only the positive halfwaves of the input signal. The filtering stage may comprise a capacitor and provides a substantially D.C. signal from the positive halfwaves.

To form an integrated rectifier circuit according to a CMOS technology, the diode is generally replaced with a diode-connected MOS transistor, that is, a transistor having its gate connected to the drain. Most of the power losses of the integrated rectifier circuit originate from the transistor in the on-state thereof and depend on the product of the current running through the transistor and of the transistor drain-source voltage. When the transistor is on, the channel current of the transistor varies according to the gate-source voltage, that is, to the drain-source voltage. To decreases losses in the rectifier circuit, the drain-source voltage should remain as small as possible when the transistor is on. It is thus desirable for the threshold voltage of the transistor to be as small as possible.

Conventionally, the MOS transistor is formed in and on a layer of a semiconductor material biased by a source of a reference voltage, for example, the ground. However, with such a MOS transistor structure, it appears to be difficult to significantly decrease the threshold voltage of the transistor. Further, especially during negative halfwaves of the input signal, additional losses can be observed because of the leakage current of the MOS transistor in the off state and to the conduction of parasitic diodes of the transistor.

SUMMARY OF THE INVENTION

At least one embodiment of the present invention aims at an electronic circuit comprising a diode-connected MOS transistor with one of its power terminals receiving an oscillating signal, for example, an A.C. signal, which has decreased losses when the transistor is on.

According to another object, at least one embodiment of the present invention aims at decreasing losses due to the leakage current of the transistor when the transistor is off.

According to another object, at least one embodiment of the present invention aims at decreasing losses due to the conduction of parasitic diodes during the evolution of the oscillating signal while the transistor is off.

Thus, an embodiment of the present invention provides an integrated circuit comprising a semiconductor layer; and a MOS transistor comprising first and second power terminals and a bulk insulated from the semiconductor layer, the first power terminal being intended to receive an oscillating signal, the transistor gate and the bulk being connected to the first power terminal.

According to an embodiment, the bulk corresponds to a portion of the semiconductor layer insulated from the rest of the semiconductor layer by a doped region, the doped region being connected to the second power terminal.

According to an embodiment, the doped region is of a first conductivity type, the first and second power terminals comprising additional doped regions of the first conductivity type, the semiconductor layer being undoped or doped of a second conductivity type, said portion of the semiconductor layer extending at least between the additional doped regions.

According to an embodiment, the circuit comprises a filter connected to the second power terminal.

According to an embodiment, the MOS transistor is an N-channel MOS transistor.

An aspect of the present invention aims at an electronic circuit comprising an integrated circuit such as previously defined; and a source of a reference voltage connected to the semiconductor layer.

According to an embodiment, the electronic circuit further comprises a first capacitor comprising a first armature connected to the first power terminal; a second capacitor comprising a second armature connected to the second power terminal and a third armature connected to the reference voltage source, and an additional diode-connected MOS transistor comprising a third power terminal connected to the first power terminal and a fourth power terminal connected to the reference voltage source.

According to an embodiment, the electronic circuit further comprises a first capacitor comprising a first armature connected to the second power terminal and a second armature; a second capacitor comprising a third armature connected to the second armature and a third armature connected to the reference voltage source; and an additional diode-connected MOS transistor comprising a third power terminal connected to the first power terminal and a fourth power terminal connected to the reference voltage source.

According to an embodiment, the electronic circuit further comprises a power source; an inductance connecting the power source to the first power terminal; an additional MOS transistor comprising a third power terminal connected to the first power terminal and a fourth power terminal connected to the reference voltage source; a source of a succession of voltage pulses at the gate of the additional MOS transistor; and a capacitor comprising a first armature connected to the second power terminal and a second armature connected to the reference voltage source.

The foregoing objects, features, and advantages of the present invention will be discussed in detail in the following non-limiting description of specific embodiments in connection with the accompanying drawings.

DETAILED DESCRIPTION

Figure 1:
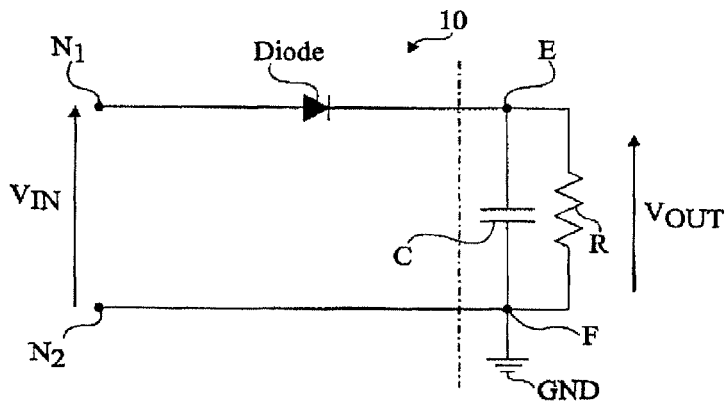
FIG. 1 schematically shows a conventional example of a rectifier circuit.

For clarity, the same elements have been designated with the same reference numerals in the different drawings and, further, as usual in the representation of integrated circuits, the various drawings are not to scale. In the following description, the source and the drain of a MOS transistor will be called power terminals of the transistor. Further, in the following description, a circuit receiving an oscillating signal is considered. An oscillating signal is a signal which alternately switches from an extremely high value to an extremely low value. The extremely high and low values may be of opposite signs. The signal is then said to be alternating. It then successively comprises a positive halfwave, a negative halfwave, a positive halfwave, a negative halfwave, etc. The oscillating signal may be periodic.

FIG. 1 schematically shows a halfwave rectifier circuit 10 with a capacitor filter. Circuit 10 comprises two input terminals $N_1$ and $N_2$ between which is applied an oscillating voltage $V_{IN}$, for example, an A.C. voltage. As an example, A.C. voltage $V_{IN}$ is a sinusoidal voltage. Voltage $V_{IN}$ may be provided from a radiofrequency signal received by an antenna. Generally, A.C. voltage $V_{IN}$ is a periodic voltage, comprising, for each period, a positive halfwave and a negative halfwave. Input terminal $N_2$ is connected to a source of a reference voltage, for example, ground GND. Circuit 10 comprises a diode Diode having its anode connected to input terminal N1 and having its cathode connected to a node E. A capacitor C is arranged between node E and a node F connected to ground GND. A resistor R is arranged in parallel across capacitor C. The voltage between nodes E and F is designated with reference $V_{OUT}$.

When rectifier circuit 10 is to be integrated according to a CMOS technology, the function of diode Diode of circuit 10 is fulfilled by a diode-connected MOS transistor.

Figure 2:
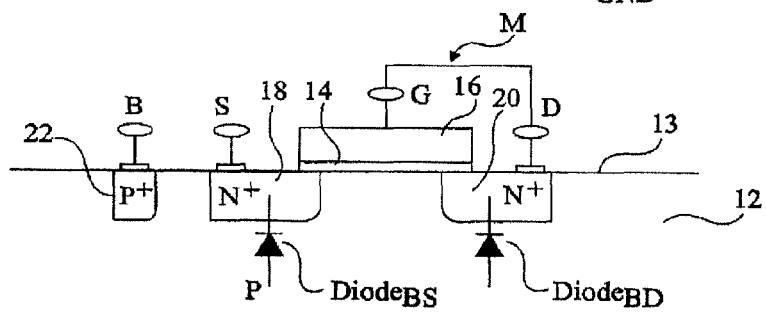
FIG. 2 is a simplified cross-section view of a conventional diode-connected MOS transistor.

FIG. 2 shows an example of a conventional structure of a diode-connected MOS transistor M formed at the level of a layer 12 of a semiconductor material, for example, P-type doped single-crystal silicon, having an upper surface 13. As an example, transistor M is an N-channel transistor. The MOS transistor comprises an insulating portion 14, for example, made of silicon oxide, covering layer 12. A portion 16 of a semiconductor material, for example, polysilicon, covers insulating portion 14. N-type doped regions 18, 20 are provided in layer 12 on either side of insulating portion 14. Regions 18 and 20 may partially extend under insulating portion 14. A P-type doped region 22 extends into layer 12 from surface 13. Region 22 is more heavily-doped than layer 12. Insulating portion 14 forms the gate insulator of transistor M and portion 16 forms the gate of transistor M. Region 18 forms the source region of transistor M and region 20 forms the drain region of transistor M.

The connections of the elements of transistor M are formed by conductive tracks and vias not shown in detail. A terminal G connected to portion 16, a terminal S connected to source region 18, and a terminal D connected to the drain region have been schematically shown in FIG. 2. A terminal B is connected to region 22 and enables to bias layer 12. In the following description, portion 16 or terminal G will indifferently be called the gate of transistor M, region 18 or terminal S will be indifferently called the source of transistor M, and region 20 or terminal D will be indifferently called the drain of transistor M. Transistor M being diode-connected, gate G is connected to drain D.

In FIG. 2, two parasitic diodes intrinsic to transistor M have been shown. A first parasitic diode $Diode_{BS}$ corresponds to the junction between layer 12 and source region 18. A second parasitic diode $Diode_{BD}$ corresponds to the junction between layer 12 and drain region 20.

Figure 3:
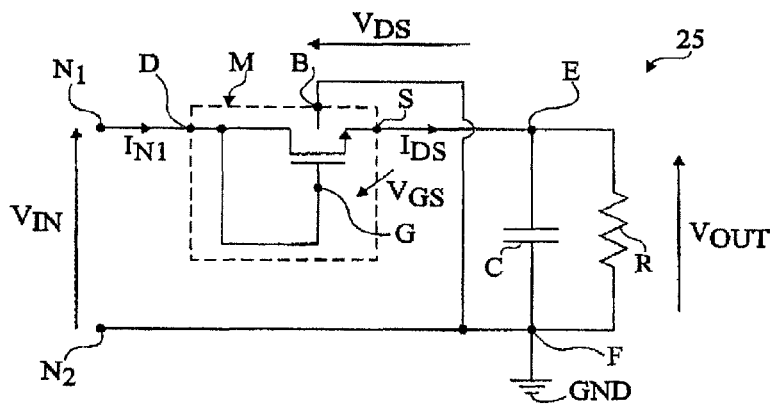
FIG. 3 schematically shows an example of a rectifier circuit using the diode-connected MOS transistor of FIG. 2.

FIG. 3 shows a rectifier circuit 25 similar to circuit 10 of FIG. 1 in which the function of diode Diode is fulfilled from diode-connected transistor M of FIG. 2. Drain D of transistor M is connected to input terminal $N_1$. Source S of transistor M is connected to node E. Bulk B of transistor M is biased to ground GND. In the following description, call $V_{DS}$ the voltage between drain D and source S of transistor M, $V_{GS}$ the voltage between gate G and source S of transistor M, and $I_{N1}$ the current at input terminal $N_1$. Rectifier circuit 25 is intended to be connected to other circuits at the level of nodes E and F.

Threshold voltage $V_{t0}$ of transistor M of circuit 10 is provided by the following relation:

$$V_{t0} = C_1 + C_2 * \sqrt{(C_3 + V_{OUT})} \quad (1)$$

where $C_1$, $C_2$, and $C_3$ are constants. Due to the filtering performed by capacitor C and resistor R, voltage $V_{OUT}$ varies little, so that threshold voltage $V_{t0}$ can be considered as substantially constant.

The losses of circuit 25 due to the conduction of transistor M are proportional to the product of voltage $V_{DS}$, equal to voltage $V_{GS}$, and of current $I_{DS}$. Such losses occur, in steady state, when voltage $V_{GS}$ is greater than threshold voltage $V_{t0}$. To reduce losses due to the conduction of transistor M, it is desirable for threshold voltage $V_{t0}$ of transistor M to be as small as possible. Relation (1) shows that threshold voltage $V_{t0}$ is directly imposed by the value of voltage $V_{OUT}$, which is generally set by the envisaged application of rectifier circuit 25. It is thus difficult to decrease threshold voltage $V_{t0}$. Further, transistor M exhibits a leakage current in the off state, especially in negative halfwaves of voltage $V_{IN}$, which increases the losses of circuit 25. Generally, the lower the threshold voltage of a MOS transistor, the greater the leakage current. It is thus not possible to simultaneously decrease threshold voltage $V_{t0}$ and the leakage current of the MOS transistor with circuit 25.

Figure 4:
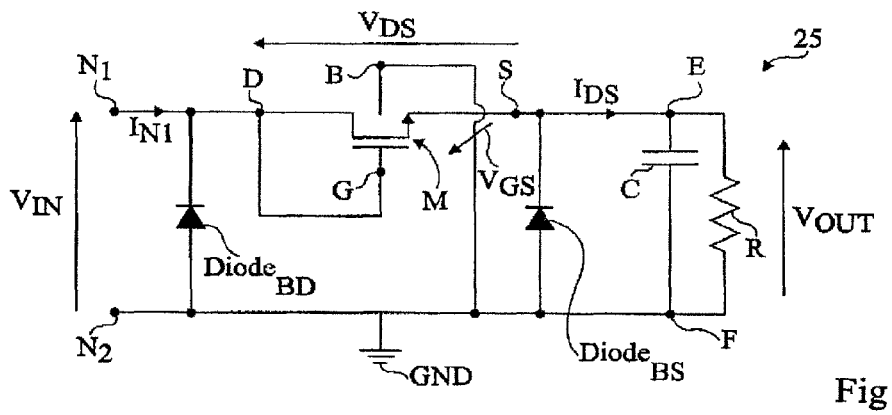
FIG. 4 is a view similar to FIG. 3, where some parasitic diodes of the diode-connected MOS transistor have been shown.

FIG. 4 shows rectifier circuit 25 of FIG. 3 in which parasitic diodes $Diode_{BS}$ and $Diode_{BD}$ of transistor M have been shown. Parasitic diode $Diode_{BD}$ extends between terminals $N_1$ and $N_2$, the anode of diode $Diode_{BD}$ being connected to input terminal $N_2$. Parasitic diode $Diode_{BS}$ extends between nodes E and F, the anode of diode $Diode_{BS}$ being connected to node F. On each negative halfwave of voltage $V_{IN}$, parasitic diode $Diode_{BD}$ may become conductive. This increases the losses of circuit 25. When parasitic diode $Diode_{BD}$ is blocked, the input impedance of circuit 25 is high. However, when parasitic diode $Diode_{BD}$ becomes conductive, the input impedance of circuit 25 drops, which may be penalizing for some applications. It may thus be necessary to limit the amplitude of voltage $V_{IN}$ to avoid the drop of the input impedance of circuit 25.

Figure 5:
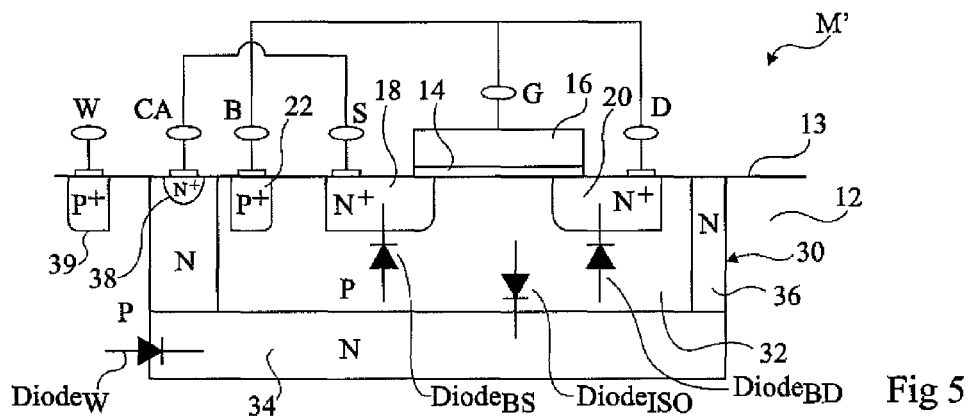
FIG. 5 shows an embodiment of a diode-connected MOS transistor according to the present invention.

FIG. 5 shows the structure of a diode-connected transistor M' according to an example of the present invention. As compared with transistor M shown in FIG. 2, transistor M' comprises a bulk insulation structure 30 which delimits a portion 32 of semiconductor layer 12 around source and drain regions 18, 20 of transistor M'. Portion 32, electrically insulated from the rest of layer 12, is called bulk 32 of transistor M' in the following description. Bulk 32 has a doping level that is low enough to result in a threshold voltage of the MOS transistor that is clearly under 0.6 V, preferentially comprised between 0.1 and 0.3 V. Bulk insulation structure 30 comprises an N-type buried layer 34 located in depth in layer 12 and extending under regions 18, 20, and 22. Bulk insulation structure 30 further comprises a lateral wall 36 corresponding to an N-type region extending from surface 13 of layer 12 all the way to buried layer 34 and surrounding regions 18, 20, and 22. An N-type region 38, more heavily doped than region 36, extends into region 36 from surface 13. A terminal CA for biasing bulk insulation structure 30 is connected to region 38. A P-type doped region 39 extends into layer 12 from surface 13 outside of bulk insulation structure 30. A terminal W is connected to region 39 and enables to bias the rest of layer 12. Transistor M' being diode-connected, gate G is connected to drain D. Further, terminal B for biasing substrate 32 is connected to drain D and terminal CA for biasing bulk insulation structure 30 is connected to source S. Terminal W for biasing layer 12 is connected to the source of reference voltage GND.

In FIG. 5, the intrinsic parasitic diodes of transistor M' have been schematically shown. Diode $Diode_{BS}$ corresponds to the junction between bulk 32 of transistor M' and source region 18. Diode $Diode_{BD}$ corresponds to the junction between bulk 32 of transistor M' and drain region 20. Diode $Diode_W$ corresponds to the junction between bulk insulation structure 30 and the portion of layer 12 outside of bulk insulation structure 30. Diode $Diode_{ISO}$ corresponds to the junction between bulk 32 of transistor M' and bulk insulation structure 30.

Figure 6:
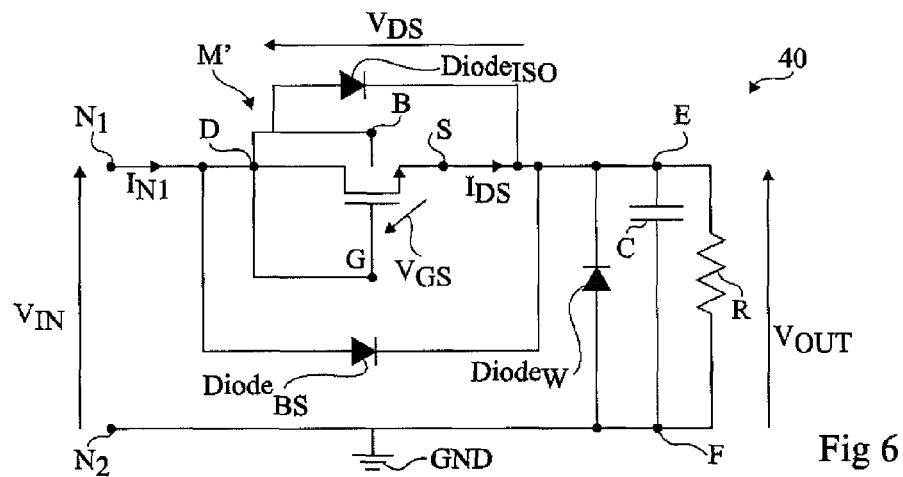
FIG. 6 shows a rectifier circuit provided with the diode-connected MOS transistor shown in FIG. 5.

FIG. 6 shows a rectifier circuit 40 similar to rectifier circuit 25 of FIG. 3 in which transistor M' is used. Parasitic diodes $Diode_{ISO}$, $Diode_{BS}$, and $Diode_W$ of transistor M' are shown. Diodes $Diode_{ISO}$ and $Diode_{BS}$ extend between drain D and node E, the anodes of diodes $Diode_{ISO}$ and $Diode_{BS}$ being connected to drain D. Diode $Diode_W$ extends between nodes E and F, the anode of diode $Diode_W$ being connected to node F. Bulk B being connected to drain D of transistor M', the junction between bulk 32 and drain region 20 is short-circuited so that parasitic diode $Diode_{BS}$ has no action.

The applicant has shown that for transistor M' connected as shown in FIG. 6, threshold voltage $V_{t1}$ of transistor M' is given by the following relation:

$$V_{t1}(t) = C_1 + C_2 * \sqrt{(C_3 - V_{GS}(t))}. \quad (2)$$

Threshold voltage $V_{t1}$ thus varies according to voltage $V_{GS}$, that is, according to voltage $V_{DS}$. In particular, $V_{t1}$ decreases when voltage $V_{GS}$ is positive and increasing. The threshold voltage $V_{t1}$ for which transistor M' turns on in a positive halfwave of voltage $V_{IN}$ is smaller than the threshold voltage $V_{t0}$ defined by relation (1). The threshold voltage of the MOS transistor is always lower than the forward voltage threshold of a bipolar diode (about 0.6 V).

Figure 7:
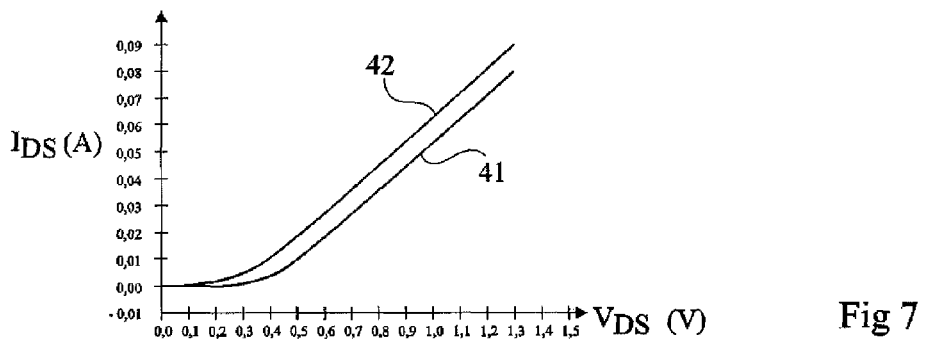
FIG. 7 shows curves of the variation of the channel current of the diode-connected MOS transistor of the circuits of FIGS. 4 and 6 according to the drain-source voltage of the transistor.

FIG. 7 shows curves 41, 42 of the variation of current $I_{DS}$ according to voltage $V_{DS}$. Curve 41 corresponds to circuit 25 of FIG. 4 for $V_{OUT}$ equal to 1 V and curve 42 corresponds to circuit 40 of FIG. 6. Since threshold voltage $V_{t1}$ of transistor M' according to the present embodiment of the invention is smaller than threshold voltage $V_{t0}$ of transistor M, for a same current $I_{DS}$, voltage $V_{DS}$ of the circuit of FIG. 6 is smaller than that of the circuit of FIG. 4. The conduction losses of circuit 40 are thus decreased with respect to circuit 25. Further, parasitic diodes $Diode_{ISO}$ and $Diode_{BS}$ of transistor M' may not become conductive.

Figure 8:
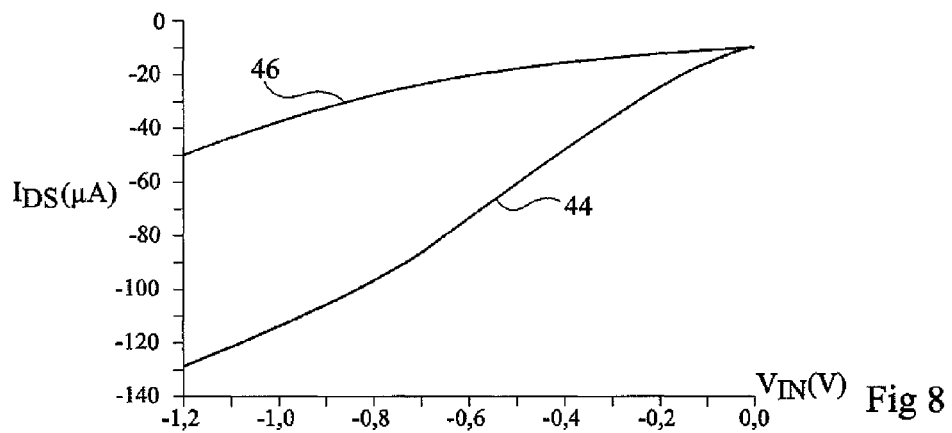
FIG. 8 shows curves of the variation of the current at the drain of the diode-connected MOS transistor of the circuits of FIGS. 4 and 6 according to the input voltage.

FIG. 8 shows curves 44, 46 of the variation of the leakage current, respectively of transistors M and M', in a negative halfwave of voltage $V_{IN}$.

For circuit 25 of FIG. 4, threshold voltage $V_{t0}$ of transistor M does not substantially vary during a negative halfwave of voltage $V_{IN}$ (relation (1)). All along the negative halfwave, voltage $V_{GS}$ is negative and greater, in absolute value, than $V_{OUT}$. Voltage $V_{t1}$ is thus greater than voltage $V_{t0}$ all along the negative halfwave. Since the leakage current of a MOS transistor decreases as the threshold voltage of the transistor increases, the leakage current of transistor M' is smaller than the leakage current of transistor M by at least a factor 2 over most of the negative halfwave.

Figure 9:
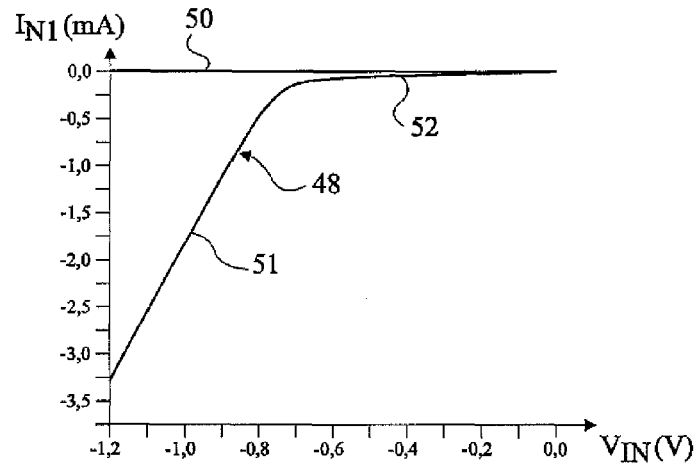
FIG. 9 shows curves of the variation of the current at the drain of the diode-connected MOS transistor of the circuits of FIGS. 4 and 6 according to the input voltage.

FIG. 9 shows curves 48, 50 of the variation of current $I_{N1}$ at input terminal $N_1$ according to voltage $V_{IN}$ in a negative halfwave of voltage $V_{IN}$. Curve 48 corresponds to circuit 25 of FIG. 4 and curve 50 corresponds to circuit 40 of FIG. 6. Curve 48 comprises a first strongly increasing portion 51 followed by a second very slightly increasing portion 52. Curve 50 only has a very slightly increasing portion. For circuit 25, in the negative halfwave, parasitic diode $Diode_{BD}$ tends to be conductive, which translates as a negative current $I_{N1}$ which strongly increases in absolute value, when negative voltage $V_{IN}$ increases in absolute value (portion 51 of curve 48). When parasitic diode $Diode_{BD}$ is no longer conductive, current $I_{N1}$ corresponds to the leakage current of transistor M during the negative halfwave (portion 52 of curve 48). For circuit 40, there no longer is any parasitic diode between input terminals $N_1$ and $N_2$. Curve 50 accurately translates the fact that current ID is only equal to the leakage current of transistor M' all along the negative halfwave which is smaller than the leakage current of transistor M. The additional losses in a negative halfwave of voltage $V_{IN}$ are thus decreased for circuit 40 with respect to circuit 25. Further, the absence of a parasitic diode for transistor M' between input terminals $N_1$ and $N_2$ results in suppressing the risk of drop of the input impedance of circuit 40. Thereby, there are no more constraints as to the amplitude of voltage $V_{IN}$ in the negative halfwave and there is no risk of modulation loss.

Figure 10:
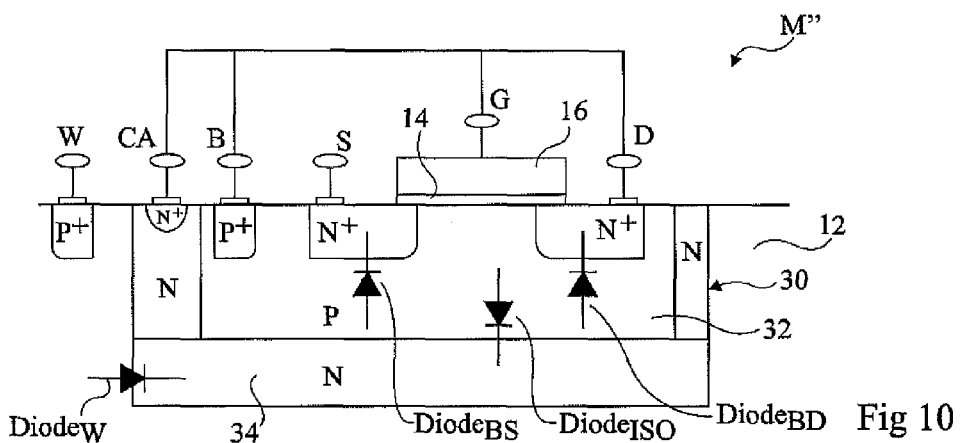
FIG. 10 shows another embodiment of a diode-connected MOS transistor according to the present invention.

FIG. 10 shows another example of a diode-connected MOS transistor structure M" according to the present invention. The structure of transistor M" is similar to that of transistor M' of FIG. 5, except that terminal CA is connected to drain D and not to source S. Terminal W is, like for transistor M', connected to ground GND. The expression of the threshold voltage of transistor M" is given by relation (2). The same advantages in terms of decrease of the threshold voltage as for the embodiment previously described in relation with FIG. 5 are obtained.

Figure 11:
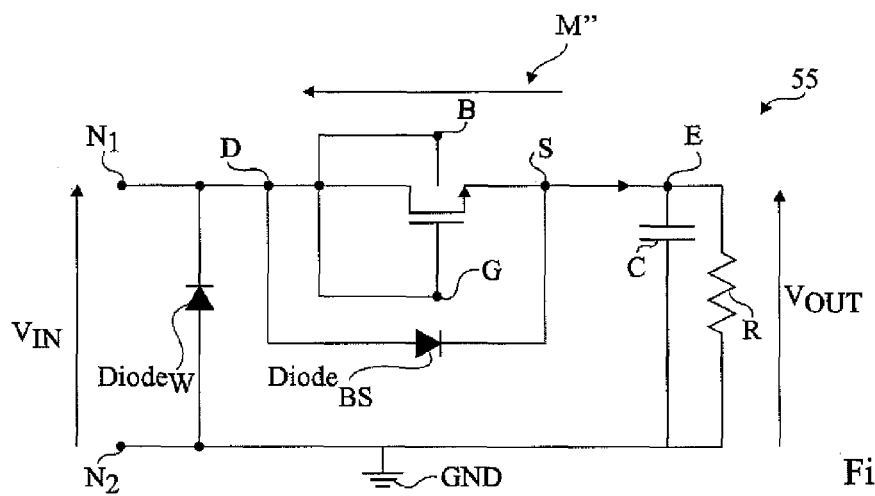
FIG. 11 schematically shows an example of a rectifier circuit using the MOS transistor of FIG. 10.

FIG. 11 shows a circuit 55 similar to circuit 40 of FIG. 6, with the difference that transistor M' is replaced with transistor M". Parasitic diode Diode$_W$ is then located between input terminals N$_1$ and N$_2$. It then has the disadvantages of circuit 10 of FIG. 4 with losses due to the conduction of parasitic diode Diode$_W$ in negative halfwaves of voltage V$_{IN}$.

Although MOS transistor M' according to the present embodiment of the present invention has been described for a rectifier circuit 40, transistor M' or M" may be used for other types of electronic circuits using a diode-connected MOS transistor having its drain receiving an oscillating signal.

Figure 12:
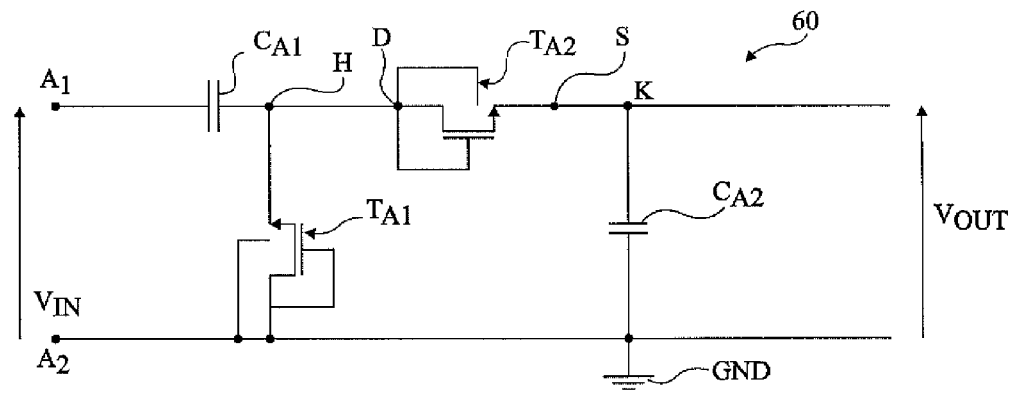
FIGS. 12 to 14 show other examples of circuits provided with the MOS transistor of FIG. 4.
Figure 13:
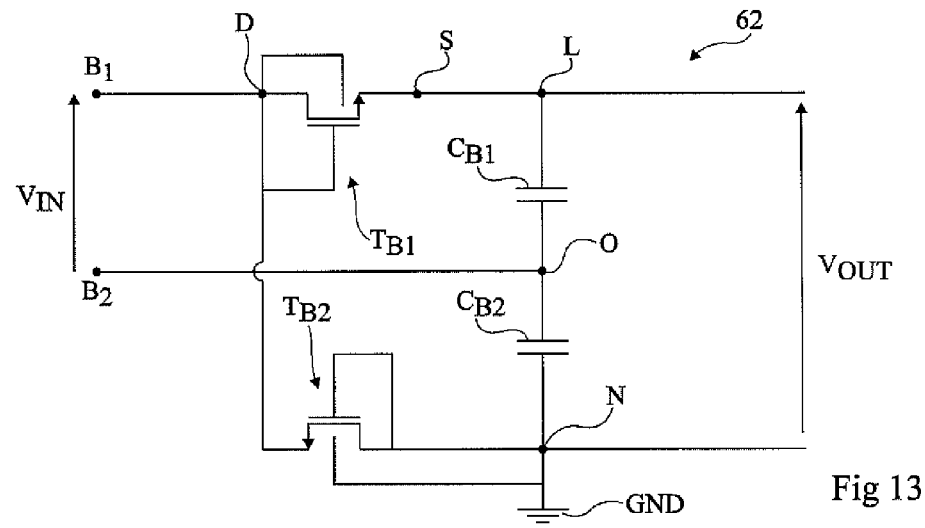
Figure 14:
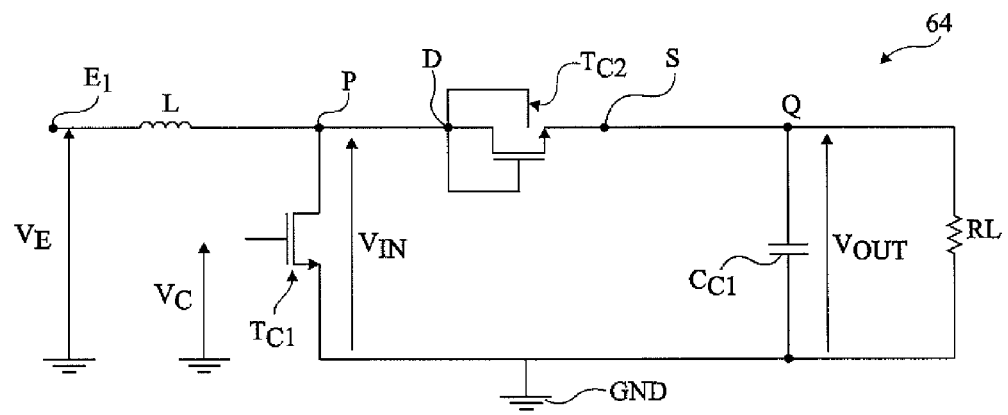

FIGS. 12 to 14 show other examples of electronic circuits in which MOS transistor M' or M" according to the previously-described embodiments of the present invention may be used.

FIG. 12 shows an example of a charge pump power-recovery circuit 60. Circuit 60 comprises input terminals A$_1$ and A$_2$ receiving A.C. voltage V$_{IN}$. Terminal A$_2$ is connected to ground GND. Terminal A$_1$ is connected to an armature of a capacitor C$_{A1}$ having its other armature connected to a node H. A diode-connected transistor T$_{A1}$ is provided between node H and input terminal A$_2$. The substrate, the gate, and the source of transistor T$_{A1}$ are connected to ground GND. Transistor T$_{A1}$ may have the structure of transistor M of FIG. 2. A diode-connected transistor T$_{A2}$ is arranged between node H and a node K. Transistor T$_{A2}$ corresponds to transistor M' or M" according to the previously-described embodiments. The substrate, the gate, and the drain of transistor T$_{A2}$ are connected to node H. Terminal CA, not shown, and the source of transistor T$_{A1}$ are connected to node K. A capacitor C$_{A2}$ is provided between node K and ground GND. Voltage V$_{OUT}$ corresponds to the voltage between node K and ground GND.

FIG. 13 shows an example of a differential-input power recovery circuit 62. Circuit 62 comprises input terminals B$_1$ and B$_2$ receiving A.C. voltage V$_{IN}$. A diode-connected transistor T$_{B1}$ is provided between input terminal B$_2$ and a node L. Transistor T$_{B1}$ corresponds to transistor M' or M" according to the previously-described embodiments of the present invention. The substrate, the gate, and the drain of transistor T$_{B1}$ are connected to terminal B$_1$. Terminal CA, not shown, and the source of transistor T$_{A1}$ are connected to node L. A capacitor C$_{B1}$ is arranged between node L and a node O connected to input terminal B$_2$. A capacitor C$_{B2}$ is arranged between node O and a node N. Node N is connected to ground GND. A diode-connected transistor T$_{B2}$ is provided between input terminal B$_1$ and node N. The substrate, the gate, and the drain of transistor T$_{B2}$ are connected to ground GND. Transistor T$_{B2}$ may have the structure of transistor M of FIG. 2. Voltage V$_{OUT}$ is taken between nodes L and N.

FIG. 14 shows an example of a step-up chopping circuit 64. Circuit 64 comprises an input terminal E$_1$ receiving a voltage V$_E$, for example, a D.C. voltage. Terminal E$_1$ is connected to a node P by an inductance L. A transistor T$_{C1}$ is provided between node P and ground GND. The gate of transistor T$_{C1}$ receives a succession of pulses of voltage V$_C$, the frequency of which depends on the desired voltage V$_{OUT}$. Oscillating voltage V$_{IN}$ is the voltage between node P and ground GND. A diode-connected transistor T$_{C2}$ is arranged between node P and a node Q. Transistor T$_{C2}$ corresponds to transistor M' or M" according to the previously-described embodiments. The substrate, the gate, and the drain of transistor T$_{C2}$ are connected to node P. Terminal CA, not shown, and the source of transistor T$_{C2}$ are connected to node Q. A capacitor C$_{C1}$ is arranged between node Q and ground GND. A resistor RL is provided across capacitor C$_{C1}$. Voltage V$_{OUT}$ corresponds to the voltage across capacitor C$_{C1}$. The operation of circuit 64 during a control cycle of transistor T$_{C1}$ schematically is the following. When transistor T$_{C1}$ is on, voltage V$_{IN}$ is substantially zero. Transistor T$_{C2}$ is then off. At the time when transistor T$_{C1}$ switches from the on state to the off state, voltage V$_{IN}$ temporarily strongly rises due to inductance L. Transistor T$_{C2}$ turns on, thus causing the charge of capacitor C. Voltage V$_{IN}$ then decreases down to V$_E$, thus turning off transistor T$_{C2}$.

Specific embodiments of the present invention have been described. Various alterations and modifications will occur to those skilled in the art. In particular, although the previously-described embodiments relate to an N-channel MOS transistor, the present invention also applies to a P-channel MOS transistor. In this case, the MOS transistor is, for example, formed in an N-type well provided at the level of a P-type doped layer. The N-type well forms the transistor substrate. P-type doped regions are provided in the N-type well and form the source and drain regions of the MOS transistor. The gate and the substrate are connected to the transistor drain.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising:
   a semiconductor layer; and
   a MOS transistor comprising:
      first and second power terminals comprising doped regions of a first conductivity type in the semiconductor layer, the semiconductor layer being undoped or doped and of a second conductivity type,
      an insulating portion covering the semiconductor layer,
      a gate covering the insulating portion, and
      a bulk corresponding to a portion of the semiconductor layer insulated from the rest of the semiconductor layer, said portion extending between the doped regions and around the doped regions,
      the first power terminal being intended to receive an oscillating signal, the gate and the bulk being connected to the first power terminal, said MOS transistor having a voltage threshold lower than 0.6 V, preferentially comprised between 0.1 and 0.3 V.

2. The integrated circuit of claim 1, wherein said portion of the semiconductor layer is insulated from the rest of the semiconductor layer by an additional doped region of the first conductivity type, the additional doped region being connected to the second power terminal.

3. The integrated circuit of claim 1, further comprising a filter connected to the second power terminal.

4. The integrated circuit of claim 1, wherein the MOS transistor is an N-channel MOS transistor.

5. An electronic circuit comprising:
   the integrated circuit of any of claim 1; and
   a source of a reference voltage connected to the semiconductor layer.

6. The electronic circuit of claim 5, further comprising:
   a first capacitor comprising a first armature connected to the first power terminal;
   a second capacitor comprising a second armature connected to the second power terminal and a third armature connected to the reference voltage source; and an additional diode-connected MOS transistor comprising a third power terminal connected to the first power terminal and a fourth power terminal connected to the reference voltage source.

7. The electronic circuit of claim 5, further comprising:
a first capacitor comprising a first armature connected to the second power terminal and a second armature;
a second capacitor comprising a third armature connected to the second armature and a third armature connected to the reference voltage source; and
an additional diode-connected MOS transistor comprising a third power terminal connected to the first power terminal and a fourth power terminal connected to the reference voltage source.

8. The electronic circuit of claim 5, further comprising:
a power source;
an inductance connecting the power source to the first power terminal;
an additional MOS transistor comprising a third power terminal connected to the first power terminal and a fourth power terminal connected to the reference voltage source;
a source of a succession of voltage pulses at the gate of the additional MOS transistor; and
a capacitor comprising a first armature connected to the second power terminal and a second armature connected to the reference voltage source.

9. A circuit comprising:
a semiconductor layer; and
a MOS transistor formed in the semiconductor layer, the MOS transistor comprising first and second power terminals, a gate, and a bulk region, the bulk region being insulated from the semiconductor layer, the transistor gate and the bulk region being electrically connected to the first power terminal, said MOS transistor having a threshold voltage lower than 0.6 V.

10. The circuit of claim 9, wherein the MOS transistor has a threshold voltage between 0.1 and 0.3 V.

11. The circuit of claim 9, wherein:
the bulk region is formed of a portion of the semiconductor layer,
the bulk region is insulated from the rest of the semiconductor layer by a doped region, and
the doped region is connected to the second power terminal.

12. The circuit of claim 11, wherein:
the doped region is of a first conductivity type,
the first and second power terminals comprise additional doped regions of the first conductivity type,
the semiconductor layer is of a second conductivity type, and
said portion of the semiconductor layer extends at least between the additional doped regions.

13. The integrated circuit of claim 9, comprising a filter connected to the second power terminal.

14. The integrated circuit of claim 9, wherein the MOS transistor is an N-channel MOS transistor.

15. An electronic circuit comprising:
the circuit of any of claim 9; and
a source of a reference voltage connected to the semiconductor layer.

16. The electronic circuit of claim 15, further comprising:
a first capacitor comprising a first armature connected to the first power terminal;
a second capacitor comprising a second armature connected to the second power terminal and a third armature connected to the reference voltage source; and
an additional diode-connected MOS transistor comprising a third power terminal connected to the first power terminal and a fourth power terminal connected to the reference voltage source.

17. The electronic circuit of claim 15, further comprising:
a first capacitor comprising a first armature connected to the second power terminal and a second armature;
a second capacitor comprising a third armature connected to the second armature and a third armature connected to the reference voltage source; and
an additional diode-connected MOS transistor comprising a third power terminal connected to the first power terminal and a fourth power terminal connected to the reference voltage source.

18. The electronic circuit of claim 15, further comprising:
a power source;
an inductance connecting the power source to the first power terminal;
an additional MOS transistor comprising a third power terminal connected to the first power terminal and a fourth power terminal connected to the reference voltage source;
a source of a succession of voltage pulses at the gate of the additional MOS transistor; and
a capacitor comprising a first armature connected to the second power terminal and a second armature connected to the reference voltage source.

19. A circuit comprising:
a semiconductor layer; and
a MOS transistor formed in the semiconductor layer, the MOS transistor comprising a gate, a bulk region, and a first terminal electrically connected to the bulk region and the gate, the bulk region being insulated from the semiconductor layer.

20. The circuit of claim 19, wherein the semiconductor layer and the bulk region each comprise a semiconductor material of the same conductivity type and the same doping.

21. The circuit of claim 20, wherein the bulk region is a portion of the semiconductor layer insulated from a remainder of the semiconductor layer.

22. The circuit of claim 19, wherein the first terminal comprises a doped semiconductor layer formed in the bulk region, the bulk region and the doped semiconductor layer being of the same conductivity type.

23. The circuit of claim 22, further comprising a second terminal electrically connected to the semiconductor layer, the second terminal comprising a second doped semiconductor layer formed in the semiconductor layer, the second doped semiconductor layer and the semiconductor layer being of the same conductivity type.

24. The circuit of claim 19, wherein the MOS transistor further comprises a first power terminal, the first power terminal being electrically connected to the gate and the bulk terminal.

25. The circuit of claim 19, further comprising:
at least one semiconductor region insulating the bulk region from the semiconductor layer, the bulk region and the semiconductor layer being of a first conductivity type and the at least one semiconductor region being of a second conductivity type; and
a first terminal electrically connected to the at least one semiconductor region.

26. The circuit of claim 25, wherein:
the MOS transistor further comprises a first power terminal, and
the first power terminal is electrically connected to the first terminal.

27. The circuit of claim 25, wherein:
the MOS transistor further comprises a gate, a second power terminal, and a second terminal electrically connected to the bulk region, and
the gate is electrically connected to the second power terminal, the first terminal, and the second terminal.

28. The circuit of claim 19, wherein the MOS transistor has a threshold voltage below 0.6 V.

29. The circuit of claim 19, wherein the MOS transistor has a threshold voltage below 0.3 V.

30. An apparatus comprising:
a diode comprising a semiconductor layer and a MOS transistor formed in the semiconductor layer, the MOS transistor comprising a gate, a bulk region, and a first terminal electrically connected to the bulk region and the gate, the bulk region being insulated from the semiconductor layer, the threshold voltage of the MOS transistor being below 0.6 V; and
a source of a reference voltage electrically connected to the semiconductor layer of the diode.

31. An apparatus comprising:
a first diode comprising a semiconductor layer and a first MOS transistor formed in the semiconductor layer, the MOS transistor comprising a first terminal, a second terminal, a gate and a bulk region, the first terminal being electrically connected to the bulk region and the gate, the bulk region being insulated from the semiconductor layer, the threshold voltage of the MOS transistor being below 0.6 V;
a source of a reference voltage electrically connected to the semiconductor layer of the diode;
a second diode comprising a second MOS transistor comprising a third terminal and a fourth terminal, the third terminal being connected to the first terminal and the fourth terminal being connected to the source of the reference voltage;
a first capacitor connected to the first terminal; and
a second capacitor connected to the second terminal and to the source of the reference voltage.

32. An apparatus comprising:
a first diode comprising a semiconductor layer and a first MOS transistor formed in the semiconductor layer, the MOS transistor comprising a first terminal, a second terminal, a gate, and a bulk region, the first terminal being electrically connected to the bulk region and the gate, the bulk region being insulated from the semiconductor layer, the threshold voltage of the MOS transistor being below 0.6 V;
a source of a reference voltage electrically connected to the semiconductor layer of the diode;
a second diode comprising a second MOS transistor comprising a third terminal and a fourth terminal, the third terminal being connected to the first terminal and the fourth terminal being connected to the source of the reference voltage;
a first capacitor connected to the second terminal; and
a second capacitor connected to the first capacitor and to the source of the reference voltage.

33. An apparatus comprising:
a power source;
a first diode comprising a semiconductor layer and a first MOS transistor formed in the semiconductor layer, the MOS transistor comprising a first terminal, a second terminal, a gate, and a bulk region, the first terminal being electrically connected to the bulk region and the gate, the bulk region being insulated from the semiconductor layer, the threshold voltage of the MOS transistor being below 0.6 V;
an inductor connecting the power source to the first terminal;
a source of a reference voltage electrically connected to the semiconductor layer of the diode;
a second diode comprising a second MOS transistor comprising a gate, a third terminal, and a fourth terminal, the third terminal being connected to the first terminal and the fourth terminal being connected to the source of the reference voltage;
a signal source connected to the gate of the second MOS transistor; and
a capacitor connected to the second terminal and to the source of the reference voltage.

\* \* \* \* \*